United States Patent
Morita et al.

(10) Patent No.: US 7,463,105 B2
(45) Date of Patent: Dec. 9, 2008

(54) MICRORESONATOR, BAND-PASS FILTER, SEMICONDUCTOR DEVICE, AND COMMUNICATION APPARATUS

(75) Inventors: Shinya Morita, Kanagawa (JP); Keitaro Yamashita, Kanagawa (JP)

(73) Assignee: Sony Corporation, Tokyo (JP)

( * ) Notice: Subject to any disclaimer, the term of this patent is extended or adjusted under 35 U.S.C. 154(b) by 117 days.

(21) Appl. No.: 11/381,796

(22) Filed: May 5, 2006

(65) Prior Publication Data
US 2006/0256823 A1 Nov. 16, 2006

(30) Foreign Application Priority Data
May 12, 2005 (JP) ............... P2005-139986

(51) Int. Cl.
*H03B 5/30* (2006.01)

(52) U.S. Cl. ............... 331/154; 331/116 M; 333/186; 333/192

(58) Field of Classification Search ............. 331/116 M, 331/154; 333/186, 192
See application file for complete search history.

(56) References Cited

U.S. PATENT DOCUMENTS
7,098,757 B2 * 8/2006 Avazi et al. ............... 333/186

OTHER PUBLICATIONS

Clark T. C. Nguyen; Microelectromechanical Components for Miniaturized Low-Power Communications; 1999 IEEE MTT-S International Microwave Symposium RF MEMS Workshop; Anaheim, California; Jun. 18, 1999.

* cited by examiner

*Primary Examiner*—Arnold Kinkead
(74) *Attorney, Agent, or Firm*—Sonnenschein Nath & Rosenthal LLP

(57) ABSTRACT

A microresonator includes a plurality of beam-type oscillator elements arranged in parallel and to which DC voltages are applied, wherein the DC voltages are caused to be different among the oscillator elements.

5 Claims, 8 Drawing Sheets

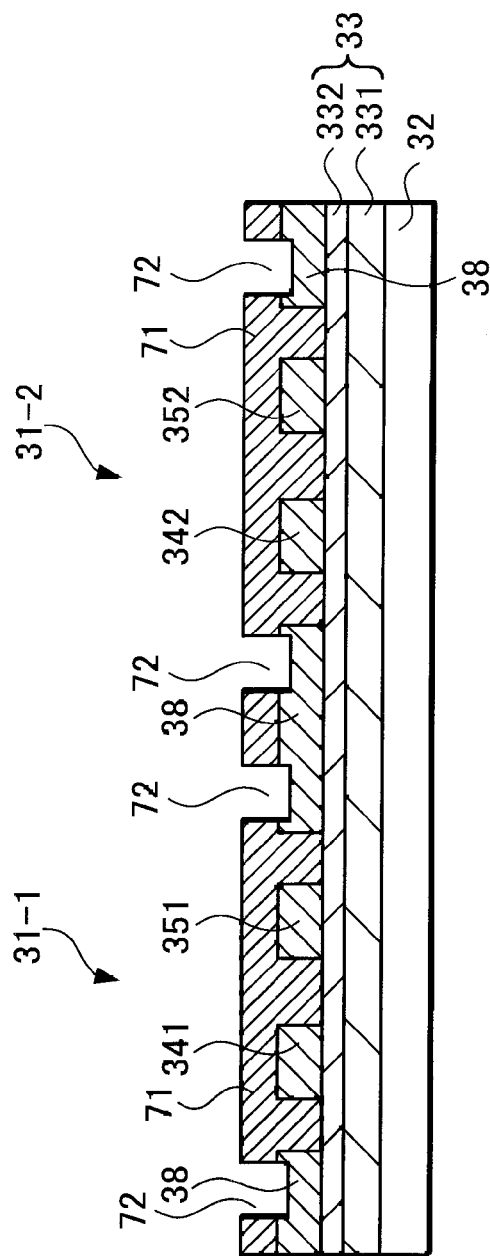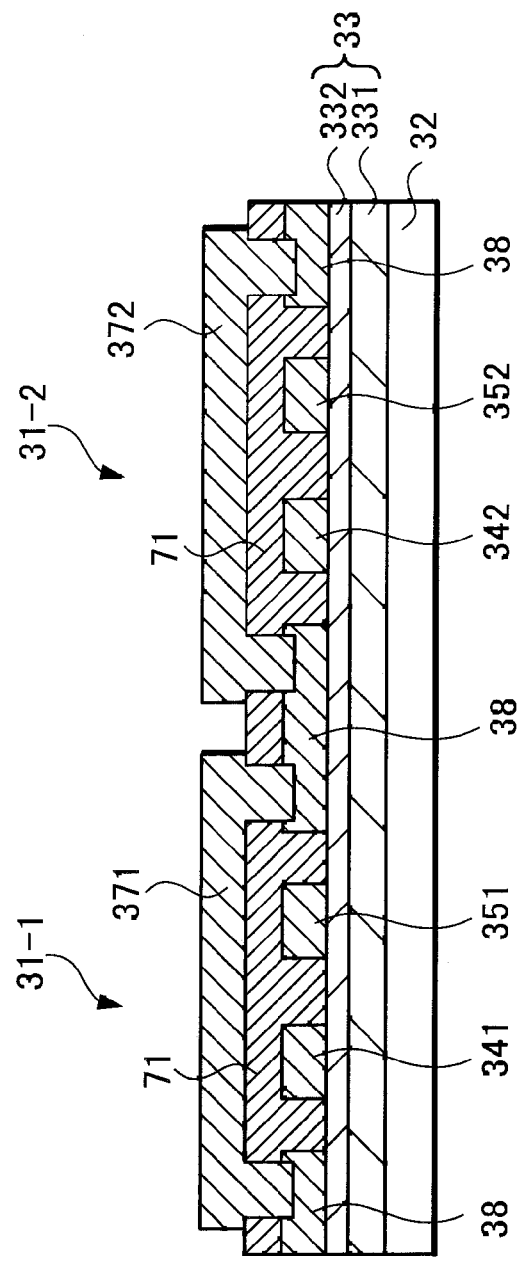

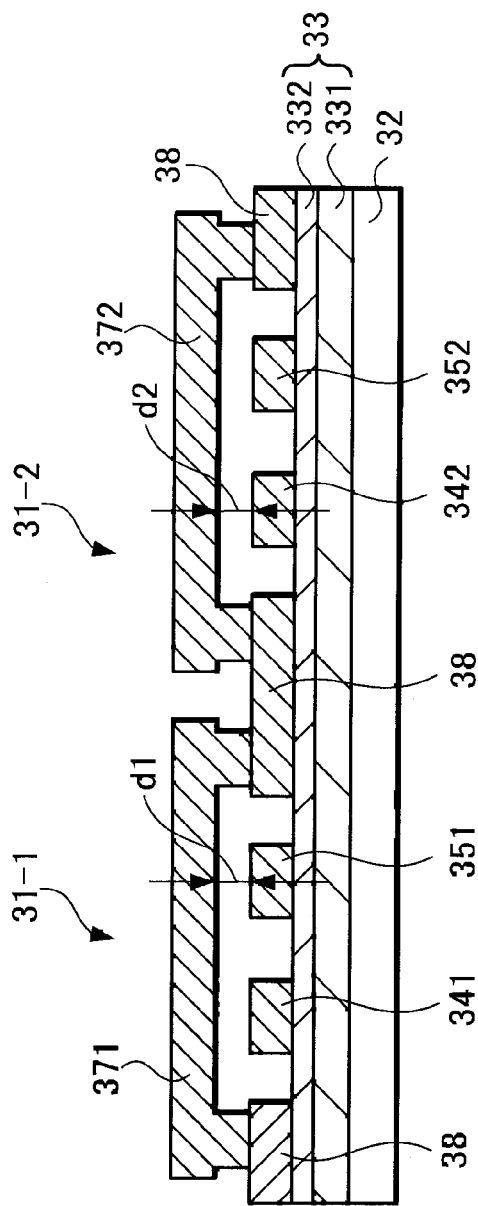
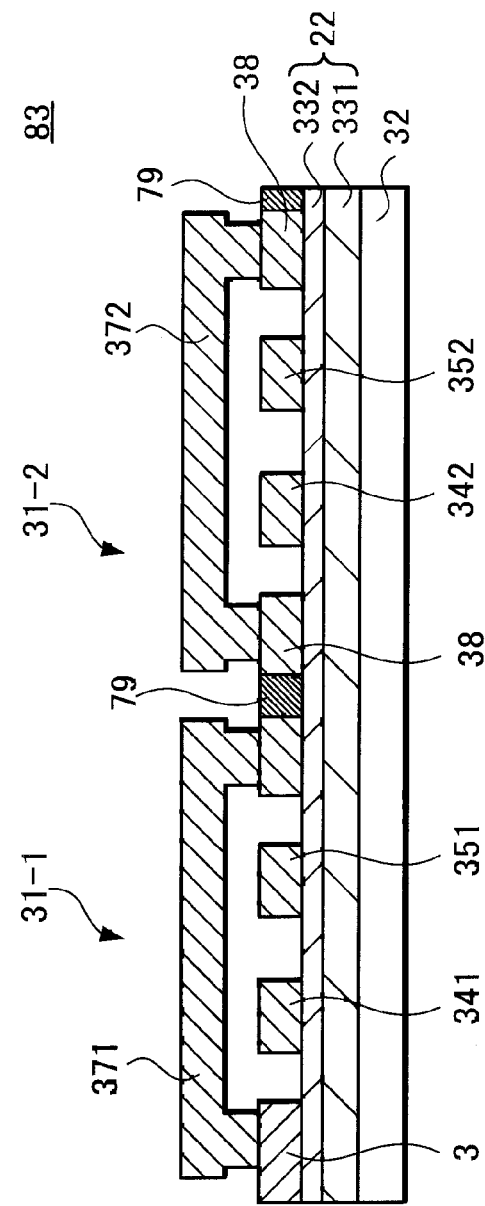
FIG. 11A
FIG. 11B

MICRORESONATOR, BAND-PASS FILTER, SEMICONDUCTOR DEVICE, AND COMMUNICATION APPARATUS

CROSS-REFERENCES TO RELATED APPLICATIONS

The present invention contains subject matter related to Japanese Patent Application JP 2005-139986, filed in the Japanese Patent Office on May 12, 2005, the entire contents of which are herein incorporated by reference.

BACKGROUND OF THE INVENTION

1. Field of the Invention

This invention relates to a microresonator including a beam-type oscillator which is electrostatically driven, a band-pass filter using this microresonator, a semiconductor device having this microresonator, and a communication apparatus using a band-pass filter based on this microresonator.

2. Description of the Related Art

In recent years, micro-oscillator elements (microresonator elements) manufactured using micromachine (MEMS: Micro-Electro-Mechanical Systems) technology have become well known. A microresonator element manufactured using semiconductor processes occupies a device small area, is capable of high Q values, and can be integrated with other semiconductor devices. With these features, applications as high-frequency filters in wireless communication device have been proposed by Michigan University and other research institutes (see Non-patent Reference 1).

Configurations are also known in which a plurality of microresonator elements are arranged in parallel to form a microresonator, for use as a high-frequency filter. Further, it is known that microresonators having different resonance frequencies can be interconnected to broaden the pass band of the filter.

However, when microresonators having different resonance frequencies are interconnected, ripple voltages occur between the microresonators, and the problem arises that the higher the Q value of the microresonators, the higher are the ripple voltages. It is known that in order to lower the ripple voltages, the Q values of the microresonators are lowered.

Hence configurations are known in which microresonator elements with different resonance frequencies are combined to form a microresonator, with the Q values of the microresonator lowered.

Non-patent Reference 1: C. T.-Nguyen, Micromechanical components for miniaturized low-power communications (invited plenary), Proceedings, 1999 IEEEMTT-S International Microwave Symposium RF MEMS Workshop, Jun. 18, 1999, pp. 48-77.

SUMMARY OF THE INVENTION

In related art, it is known that when a plurality of microresonator elements are arranged in parallel with different structures regarding the beam length, beam thickness and the like, resonance frequencies of the microresonator elements become different, and so the Q values of the microresonator can be lowered.

However, in this case it is necessary to accurately make differences in the beam lengths and beam thicknesses of the microresonator elements in the processes of manufacturing the microresonator, and so there is the problem that control of etching techniques or the like in the manufacturing processes is difficult.

It is desirable to provide a microresonator with a low Q value, in which resonator elements having different resonance frequencies are formed without employing different structures for the microresonator elements.

Further, it is desirable to provide a band-pass filter, semiconductor device, and communication apparatus which use this microresonator.

A microresonator according to an embodiment of this invention includes a plurality of beam-type oscillator elements arranged in parallel and to which DC voltages are applied, in which the DC voltages among the oscillator elements are caused to be different.

It is preferable that resistances be provided between the oscillator elements.

A band-pass filter according to an embodiment of this invention includes a microresonator having a plurality of beam-type oscillator elements arranged in parallel and to which DC voltages are applied, with the DC voltages caused to be different among the oscillator elements.

A semiconductor device according to an embodiment of this invention includes a microresonator having a plurality of beam-type oscillator elements arranged in parallel and to which DC voltages are applied, with the DC voltages caused to be different among the oscillator elements.

A communication apparatus according to an embodiment of this invention is a communication apparatus provided with a filter which performs band limiting of transmission signals and/or reception signals, in which, as the filter, a filter based on any one of the above-described microresonators is used.

According to an embodiment of a microresonator of this invention, the Q value can be kept low, and so the pass band can be broadened.

According to an embodiment of a band-pass filter of this invention, a band-pass filter having a broad pass band, in which ripple voltages are reduced, can be provided.

Further, according to an embodiment of a semiconductor device of this invention, a semiconductor device including a filter with a broad pass band and excellent characteristics can be provided.

Further, according to an embodiment of a communication apparatus of this invention, a communication apparatus with a broad pass band and excellent characteristics can be provided.

BRIEF DESCRIPTION OF THE DRAWINGS

FIGS. 10A and 10B are manufacturing process diagrams (second part) showing an example of the method of manufacturing the microresonator of FIG. 6;

FIGS. 11A and 11B are manufacturing process diagrams (third part) showing an example of the method of manufacturing the microresonator of FIG. 6.

DESCRIPTION OF THE PREFERRED EMBODIMENTS

Figure 1:
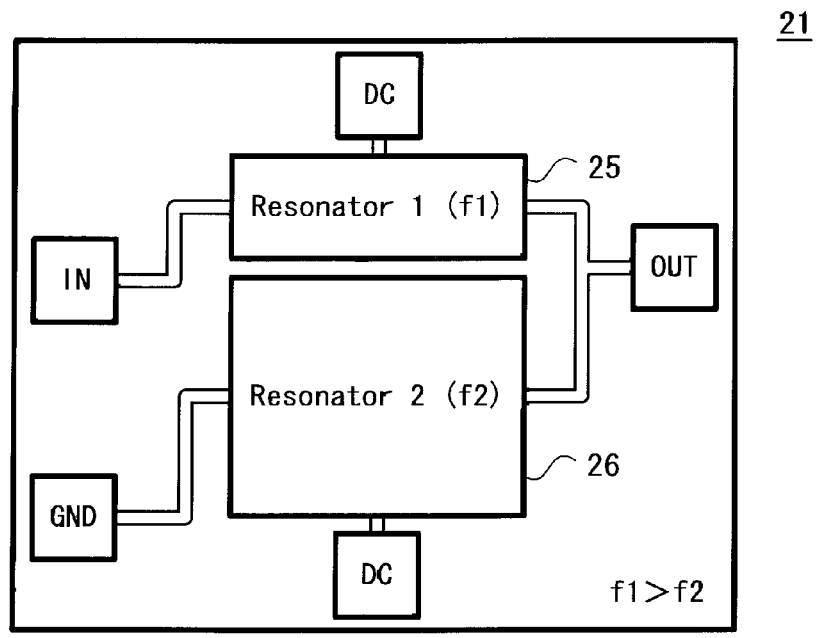
FIG. 1 is a schematic constitutional diagram showing an embodiment in which a microresonator according to an embodiment of this invention is applied to a ladder-type filter.

Hereinafter, embodiments of the present invention are explained, referring to the drawings.

FIG. 1 shows an embodiment in which a microresonator according to an embodiment of this invention is applied to a ladder-type filter. Note that, the microresonator used in this embodiment as well as in the following embodiments is a micro-scale or nano-scale element.

Figure 2:
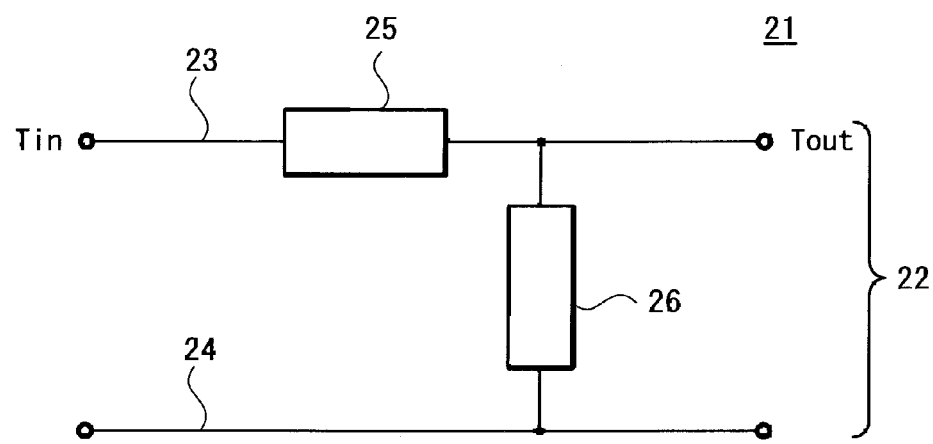
FIG. 2 is an equivalent circuit diagram of the ladder-type filter.

As indicated in the equivalent circuit of FIG. 2, a ladder-type filter 21 is configured to have high-frequency signal lines 22 including microstrip lines. A microresonator 25 with resonance frequency f1 including a plurality of parallel microresonator elements (an oscillator group) is connected in series between the input terminal IN and the output terminal OUT of a signal line 23. A microresonator 26 with resonance frequency f2, similarly including a plurality of parallel microresonator elements (an oscillator group), is also connected between the output side of the microresonator 25 and a ground (GND) line 24.

Figure 3:
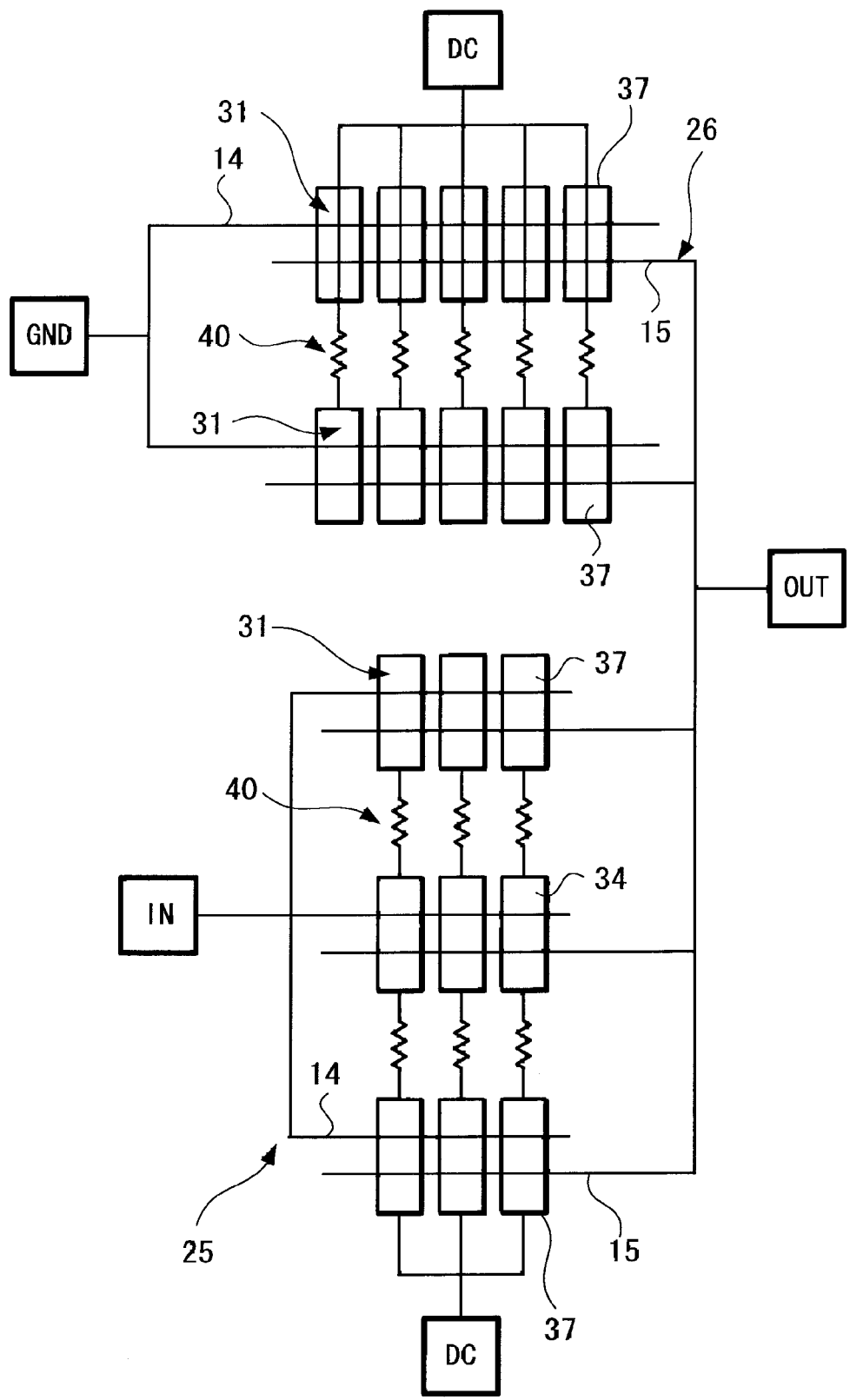
FIG. 3 is a diagram showing the embodiment of FIG. 1 in detail.

As shown in FIG. 3, microresonator elements 31 constituting the microresonator 25 and microresonator 26 are arranged such that the length of a beam 37 (beam length) is directed in the vertical direction. Further, resistances 40 are provided between the microresonator elements 31 arranged in parallel, that is, between the beams 37 to which DC bias voltages are applied.

Figure 4:
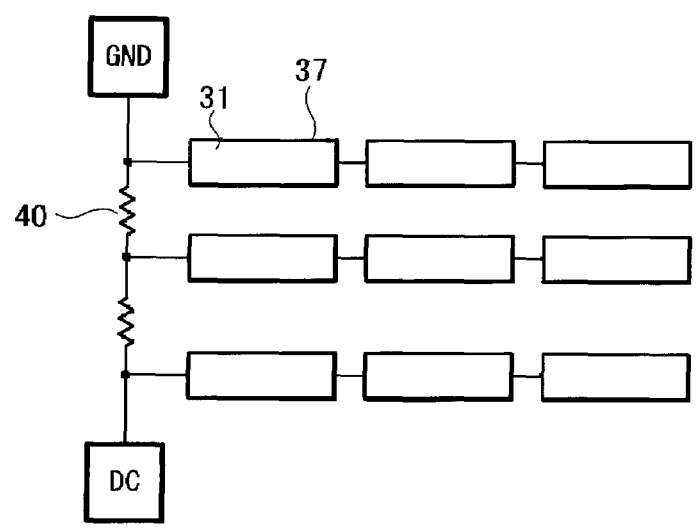
FIG. 4 is a schematic diagram showing a relevant part of another embodiment of the microresonator.

The plurality of microresonator elements arranged in parallel may also be arranged with the beam length directed in the horizontal direction, as shown in FIG. 4.

Figure 5:
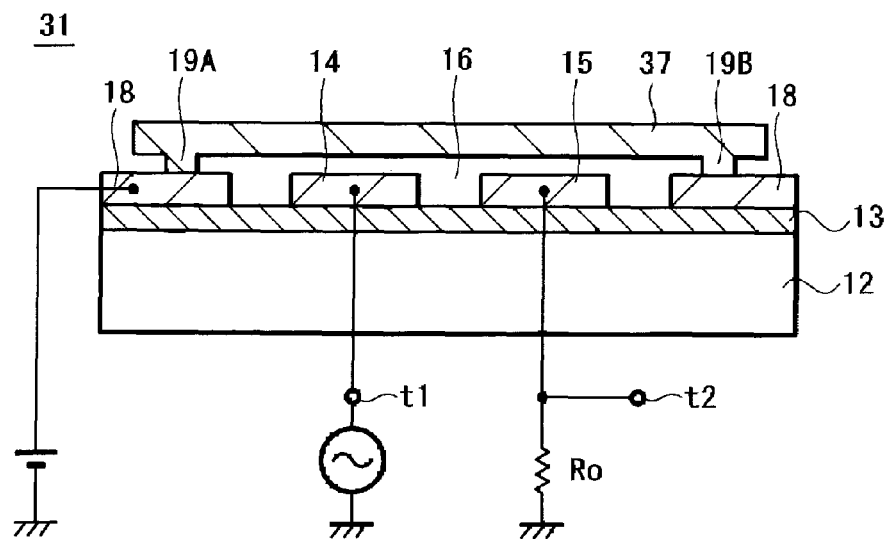
FIG. 5 is a schematic diagram of a microresonator element used in a microresonator according to an embodiment of this invention.

FIG. 5 shows an example of the microresonator element 31 used in the microresonators 25, 26.

In this oscillator 31, an input electrode 14 and output electrode 15 are formed on, for example, a semiconductor substrate 12 with an insulating film 13 in between. Opposing the input electrode 14 and output electrode 15, what is called the beam 37, which is the electrode of a vibrating plate, is formed over a space 16. The beam 37 spans the input and output electrodes 14 and 15 in the manner of a bridge, and is integrally supported at both ends by anchor portions (support portions) 19 (19A, 19B) to be connected to the wiring layer 18 positioned on the outside of the input and output electrodes 14 and 15. An input terminal t1 is led from the input electrode 14 and a high-frequency signal S1 is input through the input terminal t1, while an output terminal t2 is led from the output electrode 15. Predetermined DC bias voltage V1 is applied to the beam 37.

In this oscillator 31, when a high-frequency signal is input to the input electrode 14, the beam 37 oscillates by electrostatic force generated between the beam 37 to which DC bias voltage V1 is applied and the input electrode 14, and a high-frequency signal of intended frequency is output from the output electrode 15.

When the DC bias voltage V1 applied to the beam 37 is increased in this oscillator 31, the electrostatic force generated between the beam and the input electrode 14 increases, and what is called a softening phenomenon occurs in which the beam 37 is considerably bent toward the input electrode 14. Typically, the beam length of a microresonator element 31 with high resonance frequency is short, and the beam length of a microresonator element 31 with low resonance frequency is long. Therefore, when the value of the DC bias applied to the beam 37 increases, the bending of the beam 37 causes the apparent beam length to increase, and so the resonance frequency of the microresonator element 31 is lowered. Further, when the DC bias applied to the beam 37 is lowered, the apparent beam length is shortened without bending of the beam, and so the resonance frequency of the microresonator 31 is raised. That is, by applying different DC bias voltages to the beam 37, microresonator elements 31 having the same structure can be made to have different resonance frequencies.

Figure 6:
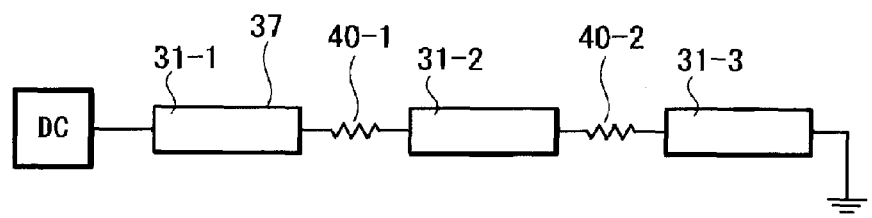
FIG. 6 is a diagram showing in detail a relevant part of the embodiment of FIG. 3.

FIG. 6 shows a relevant part of the microresonator 25 of this embodiment.

A microresonator element 31-1 connected to a DC power supply, microresonator element 31-2 and microresonator element 31-3 are arranged in parallel. Between the beam 37 of the microresonator element 31-1 and the beam 37 of the microresonator element 31-2, a resistance 40-1 is provided; and between the beam 37 of the microresonator element 31-2 and the beam 37 of the microresonator element 31-3, a resistance 40-2 is provided. The microresonator elements 31-1, 31-2, 31-3 are formed to have the same structure, including the length and thickness of the beams 37.

When a predetermined bias is applied to the beam 37 of the microresonator element 31-1 by the DC power supply, voltage drops due to the resistance 40-1, and the bias applied to the beam 37 of the microresonator element 31-2 is lower than the bias applied to the beam 37 of the microresonator element 31-1. Similarly, voltage drops due to the resistance 40-2, and so the bias applied to the beam 37 of the microresonator element 31-3 is lower than the bias applied to the beam 37 of the microresonator element 31-2. That is, the values of the bias voltages applied to the microresonator elements 31-1, 31-2, 31-3 are each different, the amount of bending of the beams 37 changes, and so the resonance frequencies of the microresonator elements 31-1, 31-2, 31-3 will be different.

The values of DC voltages applied should be different among a plurality of microresonator elements 31 arranged in parallel. The microresonator of this embodiment can also be applied to a lattice-type filter.

Figure 7:
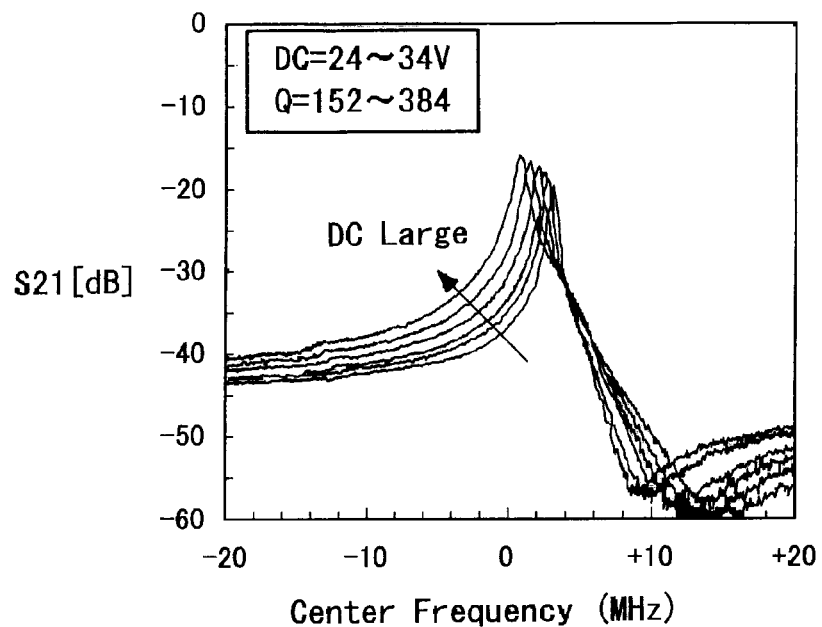
FIG. 7 is a graph showing the Q value when a DC voltage is applied to a microresonator of related art.
Figure 8:
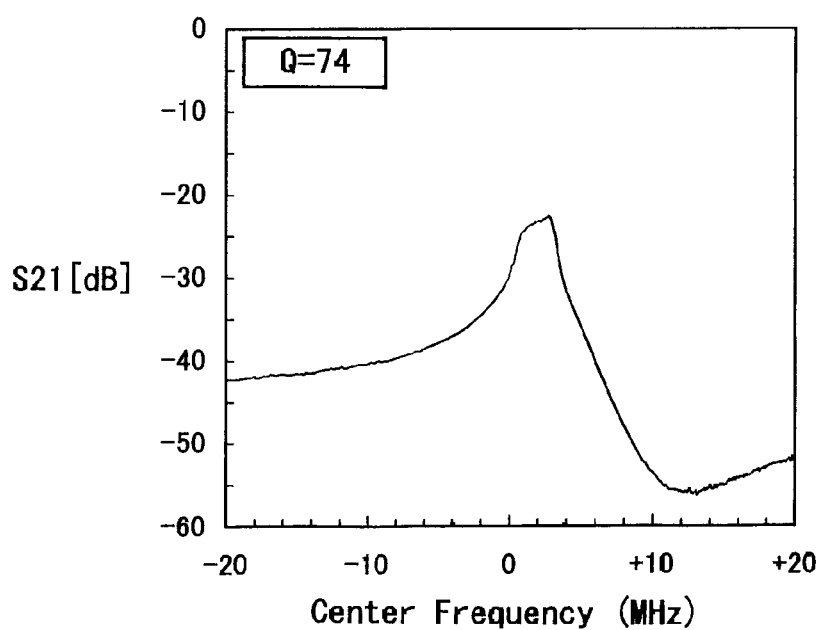
FIG. 8 is a graph showing the Q value when a DC voltage is applied to a microresonator according to an embodiment of this invention.

FIG. 7 is a graph showing the changes in Q value of a microresonator without resistances provided between microresonator elements 31, with the applied DC bias varied between 24V and 34V. FIG. 8 is a graph showing the changes in Q value of a microresonator with resistances provided between microresonator elements 31, when a predetermined DC bias is applied. As is clear from these graphs, the Q value of the microresonator with resistances provided between microresonator elements is lower than the Q value when no resistances are provided.

Next, an embodiment of a manufacturing method applied to the manufacture of microresonator elements 31-1, 31-2 in FIG. 6, is explained using FIGS. 9 to 11.

Figure 9A:
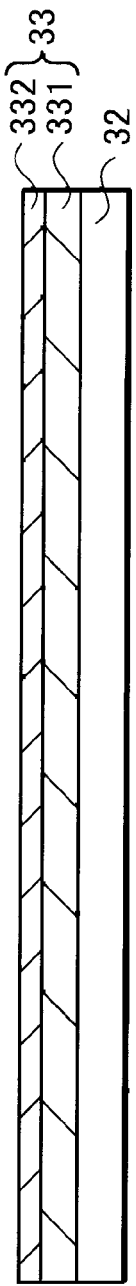
FIGS. 9A through 9C are manufacturing process diagrams (first part) showing an example of a method of manufacturing the microresonator of FIG. 6.

First, as shown in FIG. 9A, reduced-pressure CVD is used to deposit a silicon oxide ($SiO_2$) film 331 and silicon nitride (SiN) film 332 on a silicon semiconductor substrate 32 to form an insulating film 33.

Figure 9B:
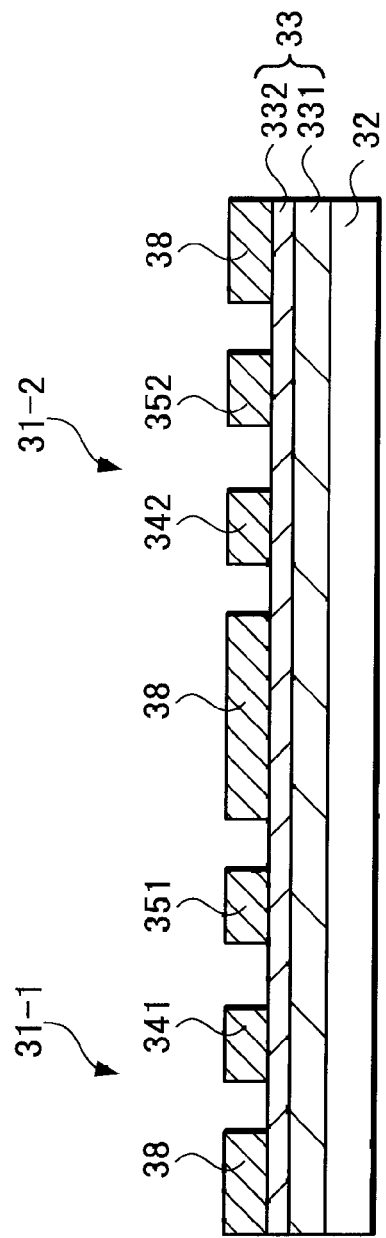

Next, as shown in FIG. 9B, after a polysilicon film containing such as phosphorus (P) is formed on the insulating film 33, lithography techniques and dry etching techniques are used to pattern the polysilicon film, to form the input electrodes 341, 342, output electrodes 351, 352, common wiring layer 38, and wiring layers 38 on both sides, which are the lower electrodes of the microresonator elements 31.

Figure 9C:
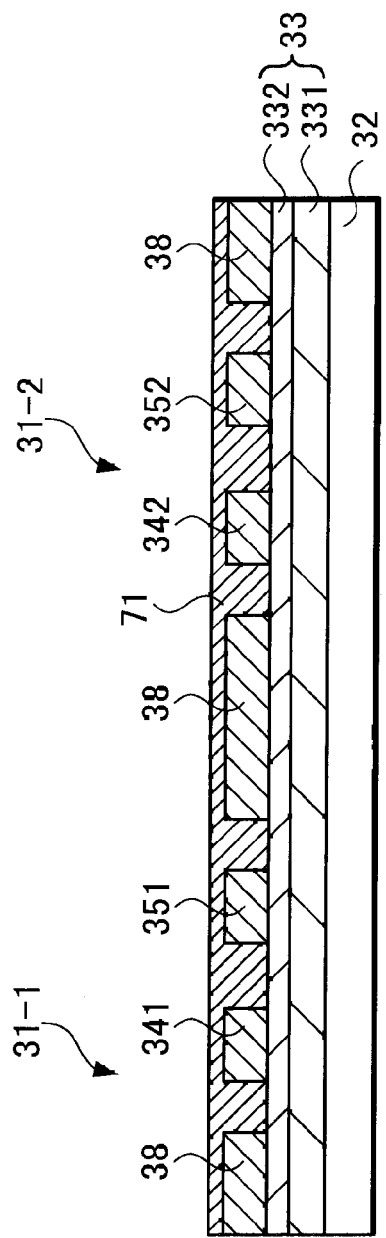

Next, as shown in FIG. 9C, a sacrifice layer 71, for example silicon oxide ($SiO_2$) film, is formed by reduced-pressure CVD on the surface including the lower electrodes which are the input electrodes 341 and 342, output electrodes 351 and 352, and wiring layer 38. The sacrifice layer 71 is formed to have a desired thickness on the surface of the lower electrodes which are the input/output electrodes 341, 342, 351, 352, and the wiring layer 38.

Next, as shown in FIG. 10A, the sacrifice layer 71, for example a silicon oxide ($SiO_2$) film, is again formed by reduced-pressure CVD over the entire surface. Then, lithography techniques and dry etching techniques are used to form contact holes 72 reaching the wiring layer 38 on the sides of each of the resonator elements.

Next, as shown in FIG. 10B, a polysilicon film is formed using, for example, reduced-pressure CVD, and lithography techniques and dry etching techniques are used to pattern the polysilicon film, to form respective beams 371, 372 and, through the contact holes 72, anchor portions connected to the wiring layer 38.

Next, as shown in FIG. 11A, DHF solution or another etching solution is used to selectively remove the silicon oxide film of the sacrifice layer 71, forming a space between the beams 371, 372 and the lower electrodes which are the input/output electrodes 341, 351 and 342, 352, to form the microresonator elements 31-1 and 31-2.

Finally, as shown in FIG. 11B, ion implantation or another method is used to introduce conductive impurities, differing from the conductive impurities contained in the wiring layer 38, to form a wiring layer portion 79 with low impurity concentration, thereby forming a resistance 40. Instead of lowering the impurity concentration of the wiring layer portion 79, the resistance 40 may be formed by reducing the width or the height of the wiring layer portion 79.

Also, instead of the wiring layer portion 79 with low impurity concentration, sputtering may be used to form a low-conductivity film, to form the resistance 40. Or, instead of the wiring layer portion 79 with low impurity concentration 79, a low-conductivity film may be formed in advance by CVD, to form the resistance 40.

The beams 371, 372 of the microresonator elements 31-1, 31-2 may be formed using polysilicon with a low impurity concentration, causing voltage drops in the beam portions.

According to the microresonator of this embodiment, the resonance frequency and Q value of each of the microresonator elements can be changed without introducing differences into the structures of the microresonator elements, and so the overall Q value of the microresonator formed with the plurality of microresonator elements can be lowered.

According to another embodiment of this invention, by interconnecting microresonators having different resonance frequencies, a band-pass filter having a signal transmission characteristic with a predetermined pass-band width can be obtained.

According to a band-pass filter of this embodiment, the Q value of the microresonator can be kept low, and so the occurrence of ripple voltages can be suppressed and a band-pass filter with a broad pass band can be provided.

In another embodiment of this invention, the above-described ladder-type filter 21, microresonator and the like can be used to configure a signal filter, mixer, resonator, and a SiP (System-in-Package) device module, SoC (System-on-Chip) device module, and other semiconductor devices including these.

According to a semiconductor device of this embodiment, a semiconductor device having excellent characteristics, with a broad pass band, can be provided.

According to embodiments of this invention, mobile phone units, wireless LAN equipment, wireless transceivers, television tuners, radio tuners, and other communication apparatuses which use electromagnetic waves for communication can be provided by employing filters based on microresonators described in the above-described embodiments.

Figure 12:
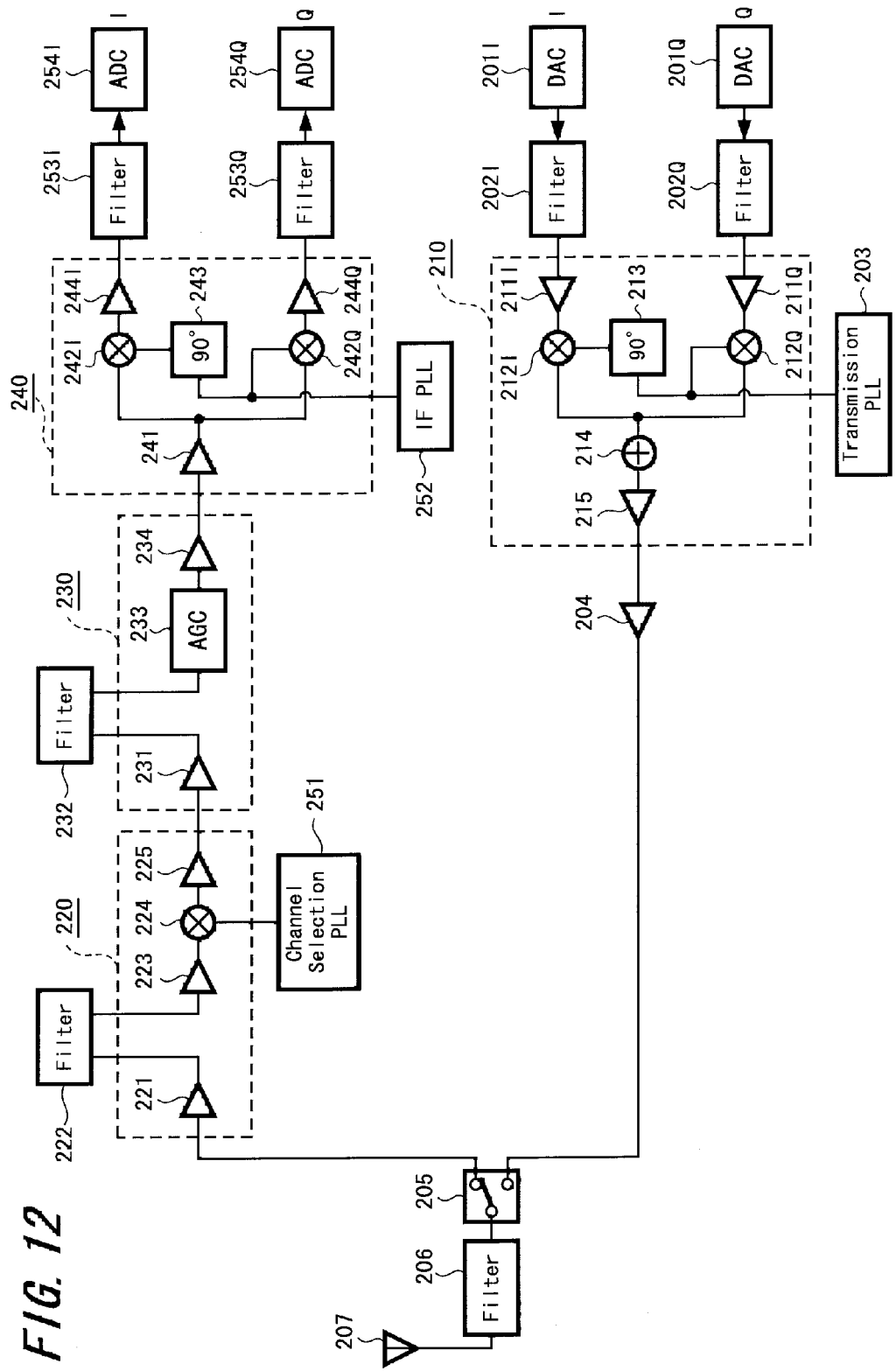
FIG. 12 is a circuit diagram showing an embodiment of a communication apparatus of this invention.

Next, referring to FIG. 12, an example of a configuration of a communication apparatus is explained, to which the filter of the above-described embodiment of this invention is applied.

First, a configuration of a transmission system is explained. Transmission data for I channel and transmission data for Q channel are supplied to digital/analog converters (DACs) 201I and 201Q respectively, and are converted into analog signals. The converted signals for each channel are supplied to band-pass filters 202I and 202Q, signal components of the transmission signals outside the pass band are removed, and the outputs of the band-pass filters 202I and 202Q are supplied to a modulator 210.

In the modulator 210, the signals for each channel are supplied to mixers 212I and 212Q via buffer amps 211I and 211Q, and are mixed with frequency signals corresponding to the transmission frequency supplied by a transmission PLL (phase-locked loop) circuit 203 to be modulated. The two mixed signals are added by an adder 214 to obtain a single series of transmission signals. In this case, the frequency signals supplied to the mixer 212I are phase-shifted by 90° by a phase-shifter 213, and so the I-channel signals and Q-channel signals are quadrature-modulated.

The output of the adder 214 is supplied to a power amplifier 204 via a buffer amplifier 215, and is amplified to a predetermined transmission power. Signals amplified by the power amplifier 204 pass through a transmission/reception switch 205 and high-frequency filter 206, and are supplied to an antenna 207. From the antenna 207, the signals are wirelessly transmitted. A high-frequency filter 206 is a band-pass filter which removes signal components outside the frequency band for transmission and reception by this communication apparatus.

As a configuration of a reception system, signals received by the antenna 207 are supplied to a high-frequency portion 220 via the high-frequency filter 206 and transmission/reception switch 205. In the high-frequency portion 220, after being amplified by a low-noise amplifier (LNA) 221, received signals are supplied to a band-pass filter 222, where signal components outside the reception frequency band are removed. The signals with these components removed are then supplied to a mixer 224 via a buffer amplifier 223. After frequency signals supplied by a channel selection PLL circuit 251 are mixed, signals for the predetermined transmission channel are made to be intermediate-frequency signals, and these intermediate-frequency signals are supplied to an intermediate-frequency circuit 230 via a buffer amplifier 225.

In the intermediate-frequency circuit 230, the supplied intermediate-frequency signals are supplied to a band-pass filter 232 via a buffer amplifier 231, and signal components outside the band of the intermediate-frequency signals are removed. After this removal, the signals are supplied to an automatic gain control (AGC) circuit 233 to obtain signals with substantially constant gain. After gain adjustment in the automatic gain control circuit 233, the intermediate-frequency signals are supplied to a demodulator 240 via a buffer amplifier 234.

In the demodulator 240, the supplied intermediate-frequency signals are supplied to mixers 242I and 242Q via a buffer amplifier 241 and are mixed with frequency signals supplied by an intermediate-frequency PLL circuit 252. Thus, the received I-channel signal components and Q-channel signal components are demodulated. In this case, frequency signals which have been phase-shifted 90° by a phase shifter 243 are supplied to the I signal mixer 242I, and the quadrature-modulated I-channel signal component and Q-channel signal component are demodulated.

The demodulated I-channel and Q-channel signals are respectively supplied to band-pass filters 253I and 253Q via buffer amplifiers 244I and 244Q. Signal components other than the signals of the I channel and Q channel are removed, and the signals after the removal are supplied to analog/digital converters (ADCs) 254I and 254Q for sampling and conversion to digital data. Thus, I channel received data and Q channel received data are obtained.

In the configuration described thus far, the filter according to the above-described embodiment can be applied, either in whole or in part, to each of the band pass filters 202I, 202Q, 206, 222, 232, 253I, and 253Q, to limit the passed frequency band.

According to an embodiment of the communication apparatus of this invention, a communication apparatus with a broad pass band and excellent characteristics can be provided.

In FIG. 12, an example of the communication apparatus performing wireless transmission and wireless reception is described, however, the filter according to the above-described embodiment can be applied to a communication apparatus including filters to perform transmission and reception via wired communication channels. Further, the filter according to the above-described embodiment can also be applied to a communication apparatus including filters to perform only transmission processing, and to a communication apparatus including filters to perform only reception processing.

It should be understood by those skilled in the art that various modifications, combinations, sub-combinations, and alterations may occur, depending on design requirements and other factors, insofar as they are within the scope of the appended claims or equivalents thereof.

What is claimed is:

1. A microresonator, comprising:
a plurality of beam-type oscillator elements arranged in parallel and to which DC voltages are applied, wherein,
the DC voltages are caused to be different among said oscillator elements, and
resistances are provided between said oscillator elements.

2. The microresonator according to claim 1, wherein said plurality of beam-type oscillator elements are formed with the same structure.

3. A band pass filter, comprising:
a plurality of beam-type oscillator elements arranged in parallel and to which DC voltages are applied, wherein,
the DC voltages are caused to be different among said oscillator elements and
resistances are provided between said oscillator elements.

4. A semiconductor device, comprising:
a microresonator including a plurality of beam-type oscillator elements arranged in parallel and to which DC voltages are applied, wherein,
the DC voltages are caused to be different among said oscillator elements and
resistances are provided between said oscillator elements.

5. A communication apparatus comprising:
a filter configured to limit a pass band of transmission signals and/or reception signals, and including a microresonator which has a plurality of beam-type oscillator elements arranged in parallel and to which DC voltages are applied, wherein,
the DC voltages are caused to be different among said oscillator elements and
resistances are provided between said oscillator elements.

* * * * *